(12) United States Patent  
Vigna et al.

(10) Patent No.: US 8,289,021 B2
(45) Date of Patent: Oct. 16, 2012

(54) MAGNETORESISTIVE SENSOR AND MANUFACTURING METHOD THEREOF

(75) Inventors: Benedetto Vigna, Pietrapertosa (IT); Simone Sassolini, Vidigulfo (IT); Lorenzo Baldo, Bareggio (IT); Francesco Procopio, Sedriano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 272 days.

(21) Appl. No.: 12/826,330

(22) Filed: Jun. 29, 2010

(65) Prior Publication Data

US 2010/0327864 A1    Dec. 30, 2010

(30) Foreign Application Priority Data

Jun. 30, 2009   (IT) .................. TO09A0496

(51) Int. Cl.
*G01R 33/02*   (2006.01)
(52) U.S. Cl. ...................................... 324/252
(58) Field of Classification Search ........... 324/252
See application file for complete search history.

(56) References Cited

U.S. PATENT DOCUMENTS

| 5,592,082 A * | 1/1997 | Kuriyama ................. 324/252 |
| 8,178,361 B2 * | 5/2012 | Naito et al. ................. 438/3 |
| 2005/0270020 A1 | 12/2005 | Peczalski et al. |

OTHER PUBLICATIONS

Kawahito, S. et al., "Micromachined Hall elements for two-dimensional magnetic-field sensing," Sensors and Actuators A40(2):141-146, Feb. 1994.

Stork, Thomas, "Electronic Compass Design using KMZ51 and KMZ52," Application Note, Philips Semiconductors, pp. 1-38, Mar. 30, 2000.

* cited by examiner

*Primary Examiner* — Reena Aurora
(74) *Attorney, Agent, or Firm* — Seed IP Law Group PLLC

(57) ABSTRACT

A magnetoresistive element formed by a strip of magnetoresistive material which extends on a substrate of semiconductor material having an upper surface. The strip comprises at least one planar portion which extends parallel to the upper surface, and at least one transverse portion which extends in a direction transverse to the upper surface. The transverse portion is formed on a transverse wall of a dig. By providing a number of magnetoresistive elements perpendicular to one another it is possible to obtain an electronic compass that is insensitive to oscillations with respect to the horizontal plane parallel to the surface of the Earth.

15 Claims, 6 Drawing Sheets

MAGNETORESISTIVE SENSOR AND MANUFACTURING METHOD THEREOF

BACKGROUND

1. Technical Field

The present disclosure relates to a magnetoresistive sensor and the method for its manufacture.

2. Detailed Description

As is known, magnetoresistive sensors exploit the capacity of appropriate ferromagnetic materials (referred to as magnetoresistive materials, for example the material known by the name of "permalloy" constituted by an iron-nickel (Fe—Ni) alloy) for modifying their own resistance in the presence of an external magnetic field.

Currently, magnetoresistive sensors are obtained from strips of magnetoresistive material. During fabrication, the strip of magnetoresistive material is magnetized so as to have a preferential magnetization in a preset direction, for example, the longitudinal direction of the strip.

In the absence of external magnetic fields, the magnetization maintains the direction imposed, and the strip has a maximum resistance. In the presence of external magnetic fields having a direction different from a preferential magnetization direction, the strip magnetization changes, as well as its resistance, as explained hereinafter with reference to FIG. 1.

In FIG. 1, a magnetoresistor 1 is formed by a strip of magnetoresistive material having a longitudinal direction parallel to axis X. The magnetoresistor 1 is traversed by a current I flowing in the longitudinal direction of the strip. An external magnetic field Hy is directed parallel to the axis Y and causes rotation of the magnetization M through an angle $\alpha$ with respect to the current I. In this case:

$$R = R_{min} + \Delta R \cos^2 \alpha$$

where $R_{min}$ is the resistance of the magnetoresistor for a magnetization M parallel to the axis Y (very high external magnetic field Hy), and $\Delta R$ is the resistance difference $R_{max} - R_{min}$, where $R_{max}$ is the resistance for a magnetization oriented parallel to the direction X. For the permalloy, the maximum ratio $\Delta R/R$ is of the order of 2-3%.

By setting $$\sin^2 \alpha = \frac{Hy^2}{Ho^2} \text{ for } Hy \leq Ho$$

and $$\sin^2 \alpha = 1 \text{ for } Hy \geq Ho$$

where Ho is a parameter that depends upon the material and upon the geometry of the strip 1, we have:

$$R = R_{min} + \Delta R \left[1 - \left(\frac{Hy}{Ho}\right)^2\right] \text{ for } Hy \leq Ho \quad (1)$$

FIG. 2 shows with a dashed line the plot of the resistance R resulting from Eq. (1) (curve A).

In order to linearize the plot of the resistance R at least in an operative portion of the curve, it is moreover known to form, above the strip of magnetoresistive material, transverse strips 2 (referred to as "barber poles") of conductive material (for example aluminum), arranged at a constant distance from one another and with an inclination of 45° with respect to the direction X, as shown in FIG. 3.

In this situation, the direction of the current I changes, but not the magnetization. Consequently, Eq. (1) becomes:

$$R = R_{min} + \frac{\Delta R}{2} \pm \Delta R \left(\frac{Hy}{Ho}\right)\left[1 - \left(\frac{Hy}{Ho}\right)^2\right] \text{ for } Hy \leq Ho \quad (2)$$

which has a linear characteristic in the neighborhood of the point Hy/Ho=0, as shown by the curve B with solid line of FIG. 2. The sign ± in Eq. (2) depends upon the orientation of the barber poles 2 (±45°).

FIG. 4 shows a magnetoresistive sensor 9 including four magnetoresistors 1 having barber poles 2 arranged in an alternating way and connected so as to form a Wheatstone bridge. In detail, the two magnetoresistors 1a, 1b belonging to each branch 3, 4 have barber poles 2 oriented in an opposite way, are arranged diametrally opposite, and are connected in series between two terminals 5, 6. A biasing voltage Vb is applied to the terminals 5, 6.

Trimmer resistors can be connected in series to each branch 3, 4, in a way not shown, so as to have a zero output in the absence of an external magnetic field oriented parallel to the direction of detection (here the field Hx).

The output voltage Vo existing between the intermediate nodes 7, 8 of the branches 3, 4 is thus correlated to the existing external magnetic field Hx. In fact, an external magnetic field Hx causes an increase in the resistivity of the magnetoresistors 1a having barber poles 2 oriented in a first direction and a corresponding reduction in the resistivity of the other magnetoresistors 1b. Consequently, any variation of resistance due to an external field causes a corresponding linear variation of the output voltage Vo, and thus a linear relationship between them exits.

Given the high sensitivity of the magnetoresistive sensors of the type indicated, use thereof has been recently proposed for electronic compasses in navigation systems. In this case, the external field to be detected is the Earth's magnetic field. To a first approximation, the Earth's magnetic field can be considered parallel to the surface of the Earth and the compass uses two sensors sensitive to the two directions of the plane that is locally tangential to the surface of the Earth. However, since the inclination of the compass with respect to the tangential plane entails reading errors, the compass may have three sensors, each having a sensitive axis oriented according to the three spatial axes X, Y, Z, in order to correct the reading errors.

To this aim, the three sensors are arranged such that they are rotated through 90° with respect to one another. Whereas building a sensor sensitive to fields oriented along two directions does not create any difficulty, since they lie in a same plane, the detection of the third direction is critical, since it requires the provision of a third sensor arranged in a plane perpendicular to the first two sensors. In fact, in this case, the assembly operations are much more complex and the end device is much more costly.

BRIEF SUMMARY

One embodiment is a magnetoresistive element which is sensitive to external magnetic fields oriented in a direction transverse to the plane of the magnetoresistive element.

One embodiment is a triaxial magnetoresistive sensor, which uses this magnetoresistive element.

According to the present disclosure, a magnetoresistive element, a magnetoresistive sensor, an electronic-compass device, and a method for manufacturing a magnetoresistive element are provided as defined in claims 1, 6, 10, and 11, respectively.

BRIEF DESCRIPTION OF THE SEVERAL VIEWS OF THE DRAWINGS

For an understanding of the present disclosure, preferred embodiments thereof are now described, purely by way of non-limiting example, with reference to the attached drawings, wherein.

DETAILED DESCRIPTION

Figure 5:
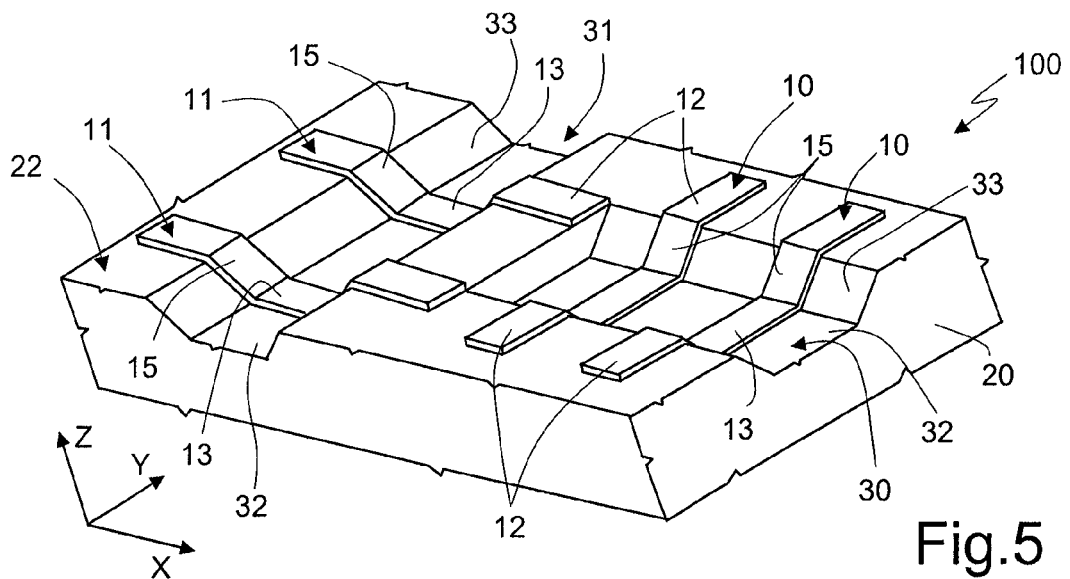
FIG. 5 is a perspective view of one embodiment of the present magnetoresistive element.

FIG. 5 shows a perspective view of a portion of a chip 100 comprising a substrate 20 of semiconductor material having an upper surface 22, which is planar and presents recesses 30, 31 on which magnetoresistors 10, 11 are provided. In the example illustrated, the recess 30, of an elongated shape, is oriented parallel to the direction X, and the recess 31, which has also an elongated shape, is oriented parallel to the direction Y. The recesses 30, 31 each have a bottom wall 32, which is planar and parallel to the upper surface 22, and two sloping walls 33, formed on the longitudinal sides of the respective bottom walls 32.

The magnetoresistors 10, 11 are formed by strips of magnetoresistive material. In the example illustrated, the magnetoresistors 10 are parallel to each other and perpendicular to the longitudinal direction of the respective recess 30, and the magnetoresistors 11 are arranged parallel to each other and perpendicular to the longitudinal direction of the respective recess 31 and to the magnetoresistors 10.

The magnetoresistors 10, 11 are non-planar and have at least one horizontal portion and one inclined portion. In the example shown, each magnetoresistor 10, 11 has two end portions 12, which extend on the upper surface 22 of the substrate 20, a central portion 13, which extends on the bottom wall 32 of a respective recess 30, 31, and two transverse portions 15, which extend obliquely between the central portion 13 and the end portions 12, along sloping walls 33 of the recess 30 and 31, respectively.

In practice, in the magnetoresistors 10, the portions 12, 13 have a direction parallel to the axis Y, and the transverse portions 15 have a direction with a component parallel to the axis Z. Likewise, in the magnetoresistors 11, the portions 12, 13 have a direction parallel to the axis X, and the corresponding transverse portions 15 have a direction with a component parallel to the axis Z. Thereby, and as discussed in greater detail hereinafter, the magnetoresistors 10 are sensitive to magnetic fields directed along the axes X and Z, while the magnetoresistors 11 are sensitive to magnetic fields directed along the axes Y and Z.

Figure 4:
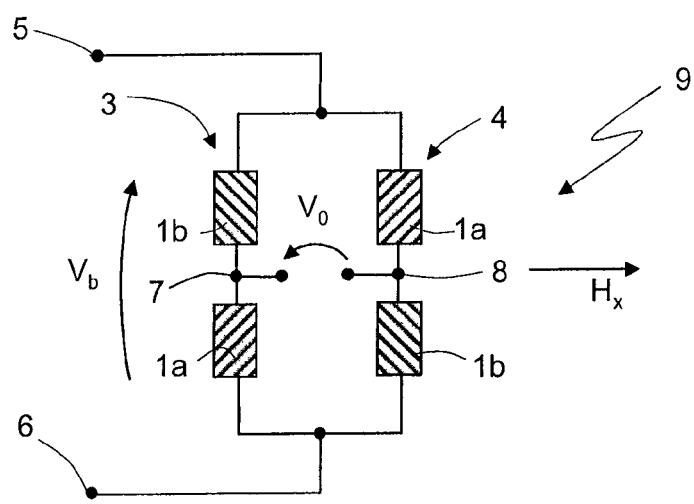
FIG. 4 illustrates a magnetoresistive sensor in Wheatstone-bridge configuration.

Like known magnetoresistive sensors, the magnetoresistors 10, 11 can be provided with barber poles, in a way not shown, but similar to the above, as shown in FIG. 4 for the sensor 9. In addition, they can be connected in a Wheatstone-bridge configuration, as shown in FIG. 11, to eliminate the sensitivity along the axis Z.

The magnetoresistors 10, 11 are manufactured in the way described hereinafter with reference to FIGS. 6-11.

Initially (FIG. 6), on the substrate 20 of semiconductor material having the planar upper surface 22, an etch mask 21 of resist is formed and covers the entire upper surface 22 of the substrate 20 except where the recesses 30, 31 (FIG. 5) are to be formed.

Next, the exposed portions of the substrate 20 are etched with TMAH (tetramethyl ammonium hydroxide) to form the recesses 30, 31. On account of the type of etch used, the recesses 30, 31 have a planar bottom wall 32 and sloping walls 33, which are arranged at an angle of 54° with respect to the bottom wall 32.

Figure 6:
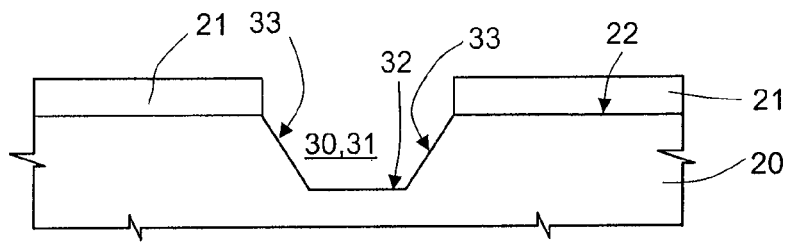
FIGS. 6 to 10 are cross-sections through a semiconductor material wafer in successive manufacture steps of the sensor of FIG. 5.
Figure 7:
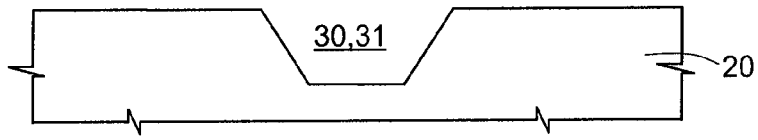
Figure 8:
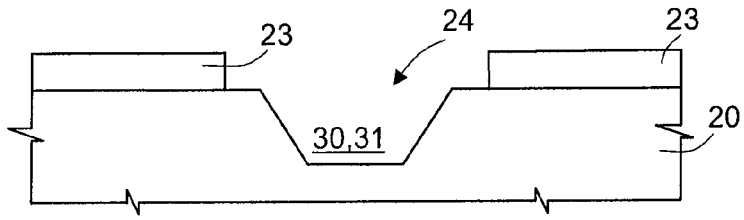
Figure 9:
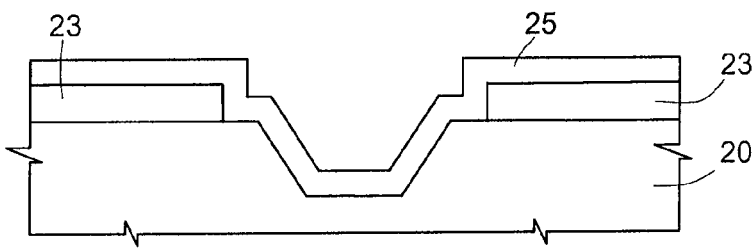
Figure 10:
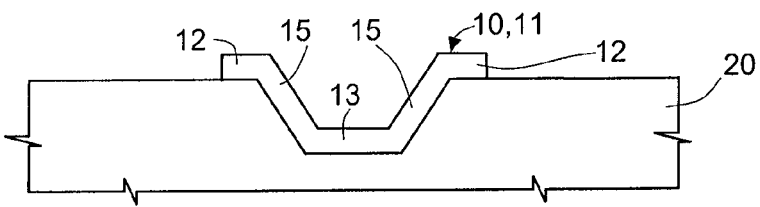

In a way not visible in FIG. 6, the recesses 30 have a longitudinal direction parallel to the axis X, and the recesses 31 have a longitudinal direction parallel to the axis Y, as is shown in FIG. 5.

Then (FIG. 7), the etch mask 21 is removed.

Next (FIG. 8), by a resist deposition step and a standard photolithography, a resistor mask 23 is formed on the substrate 20. The resistor mask 23 covers the entire upper surface 22 of the substrate, including the recesses 30, 31, except for strip-shaped windows 24 where the magnetoresistors 10, 11 are to be provided. The windows 24 thus have exactly the shape desired for the magnetoresistors 10, 11.

Then (FIG. 9), a thin film 25 of magnetoresistive material, for example permalloy, is deposited. Finally (FIG. 10), the resist of the resistor mask 21 is dissolved via solvents, in a per se known manner, and the metal above the resist mask 21 is removed (lift off technique), leaving the magnetoresistive material only at the windows 24 of the resistor mask 21. The magnetoresistors 10, 11 are thus formed.

Figure 1:
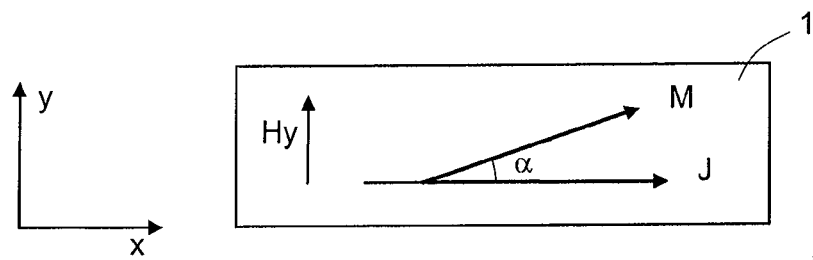
FIG. 1 shows a magnetoresistive element of a known type.
Figure 2:
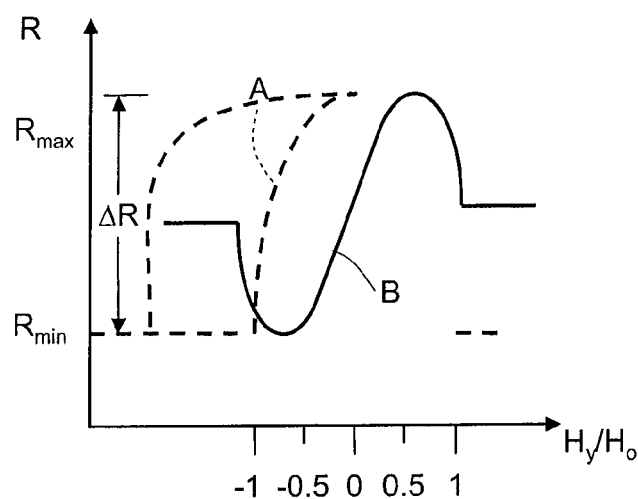
FIG. 2 shows the resistance variation as a function of the field applied for the elements of FIGS. 1 and 3.
Figure 3:
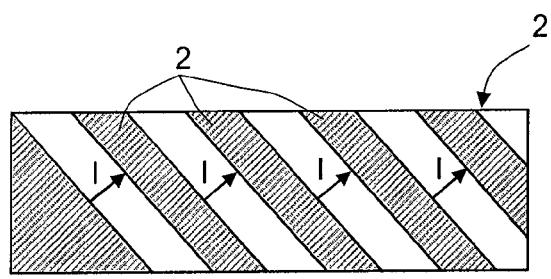
FIG. 3 shows a different known magnetoresistive element.

Next, if so desired, the magnetoresistors 10, 11 can be provided with aluminum barber poles, as described in FIG. 3. In addition, the electrical connections and possible trimmer resistors are provided to form magnetoresistive sensors in bridge configuration.

Thanks to the presence of the inclined portions 15, the magnetoresistors 10, 11 can detect the presence of magnetic fields directed in all three spatial directions and/or can be connected together so as to be insensitive to fields oriented in a particular direction, as discussed hereinafter with reference to FIGS. 11a, 11b, and 11c.

Figure 11A:
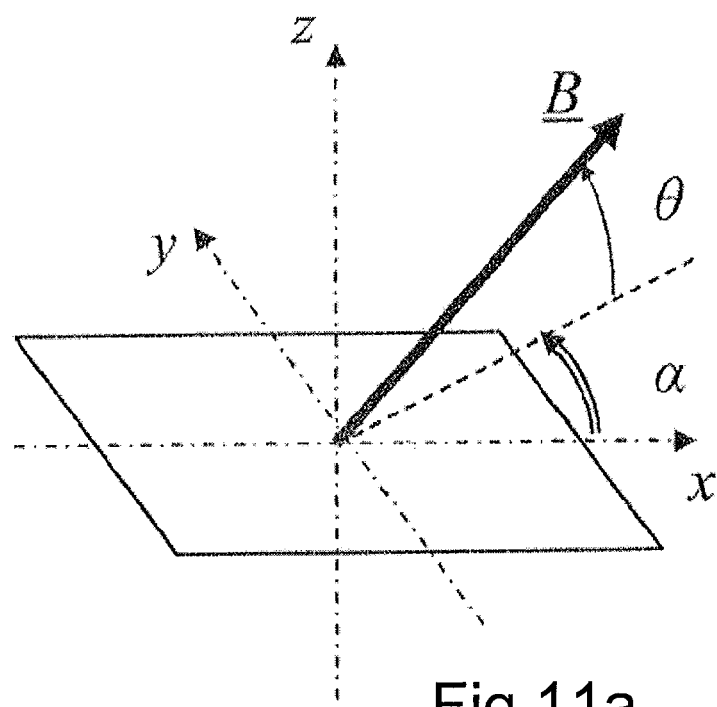
FIGS. 11a, 11b and 11c show the dependence upon the direction of the magnetic field of the present magnetoresistive element and of a Wheatstone bridge formed starting from the present magnetoresistive element.

In FIG. 11a, a magnetoresistive element (not shown) extends in the plane XY for detecting a magnetic field B having, in spherical co-ordinates, an angle a (zenith or longitude) with respect to the axis X and an angle θ (azimuth) with respect to the plane XY. In this condition, the component of the magnetic field visible in the plane XY is $B*\cos(\theta)$, and the behavior of the resistance of a magnetoresistive element arranged in the plane is of the type:

$$R = R_{min} + \frac{\Delta R}{2} \pm (\Delta R \cdot \tan\alpha \cdot \cos^2\alpha) \cdot \cos^2\theta \qquad (3)$$

Figure 11B:
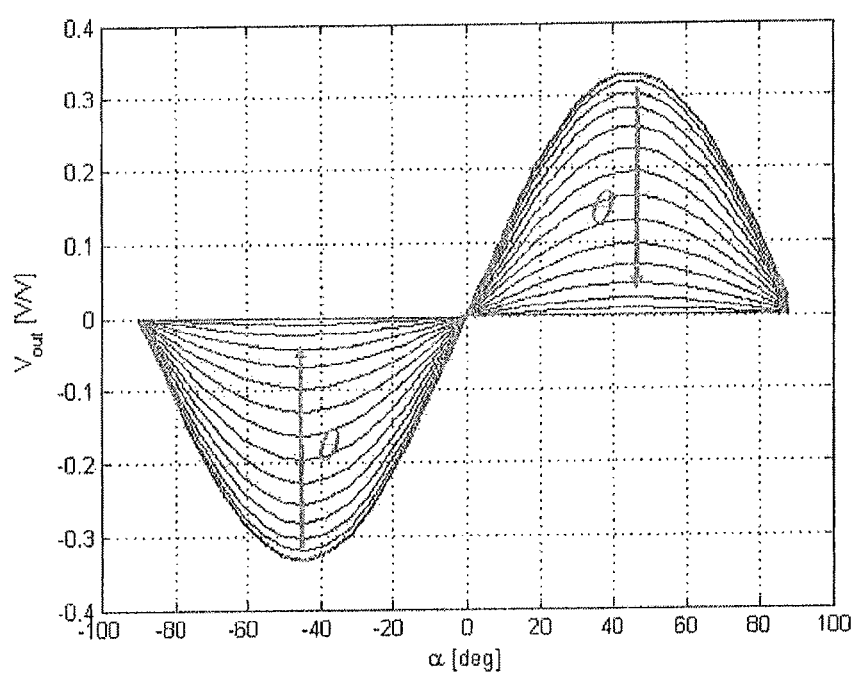

FIG. 11b shows the output voltage generated by a magnetoresistive element of the above sort in the plane XY as α varies, for different values of θ, from 0 to 90°, in which the values on the axis Y are purely exemplary. As may be noted, the output is maximum in the case of field B parallel to the plane XY (θ=0°) and zero in the case of field B perpendicular to the plane (θ=90°).

Instead, the dependence of the inclined portions 15 of magnetoresistive elements 10, 11 having as upper surface 22 the plane XY, on the hypothesis of an angle of 45° with respect to the plane XY, is the following:

$$R = R_{min} + \frac{\Delta R}{2} \pm (\Delta R \cdot \tan\alpha \cdot \cos^2\alpha) \cdot \sin^2\theta \qquad (4)$$

Figure 11C:
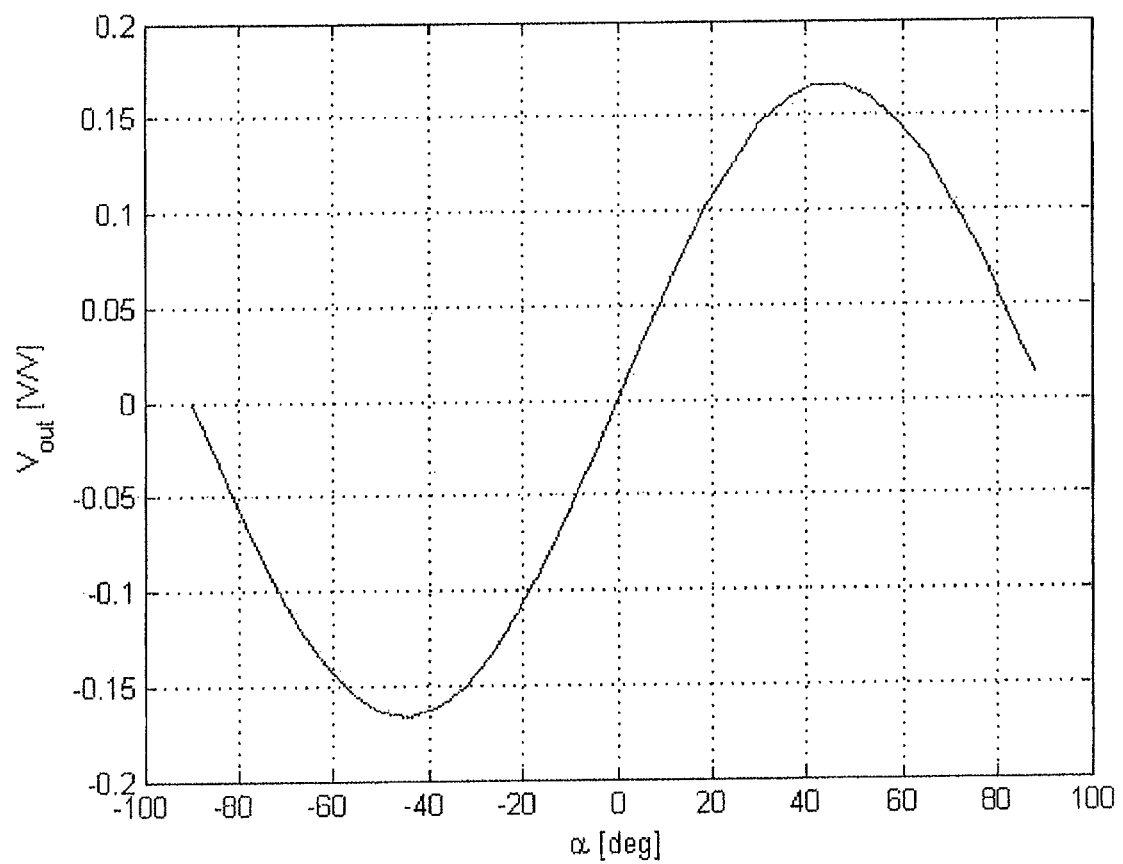

By connecting pairs of magnetoresistive element 10, 11 in bridge configuration, it is possible (as may be shown using simple trigonometric rules) to eliminate the dependence upon the angle θ completely, as shown in FIG. 11c (the curves at different angles θ are superimposed, i.e., coincident). In practice, it is possible to exploit the dependence of the individual magnetoresistive elements 10, 11 upon different components of the magnetic field to reject from the output of the bridge the component along the axis Z of the magnetic field B in order to obtain a compass that is not affected by the planarity error thereof with respect to the surface of the Earth. In practice, this is obtained by appropriately choosing the ratio between the area of the inclined portions 15 and the area of the planar portions (portions 12, 13).

In this way, the inclination of the bridge-configuration magnetoresistive sensor has no effect upon the axis of the component of the magnetic field to which the sensor is dedicated. Furthermore, in the case of sensors sensitive, respectively, to magnetic fields in the directions X and Y, it is not necessary to use a third sensor purposely provided for the direction Z and the corresponding electronics for compensating for the variations of the signals along X and Y in the case of movements of the magnetoresistive sensor in bridge configuration with respect to the horizontal plane ("tilting" movements).

Figure 12:
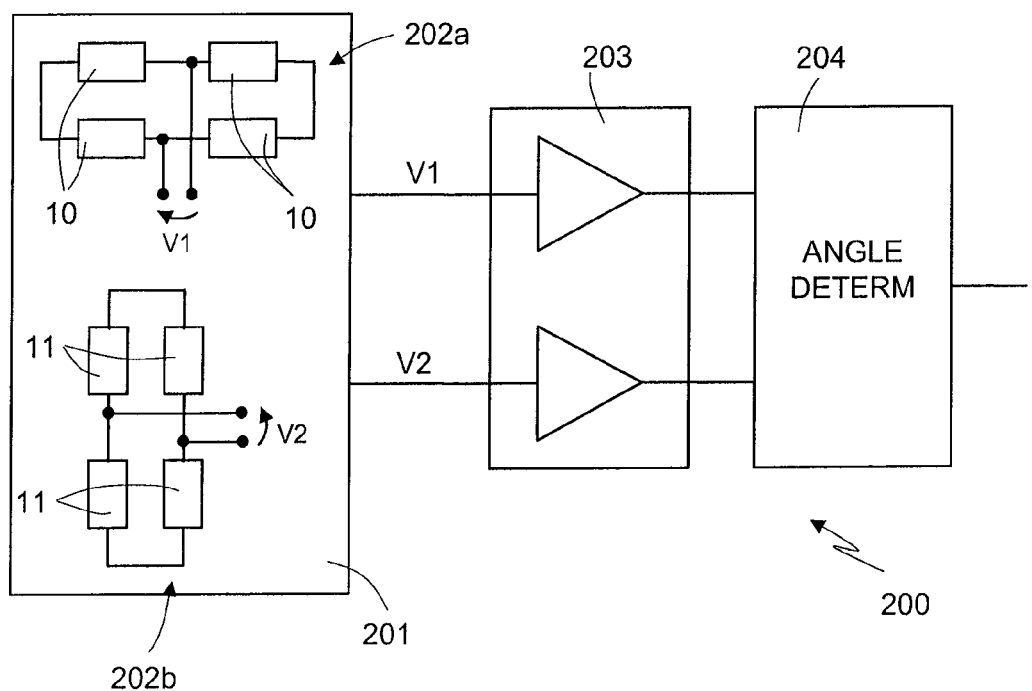
FIG. 12 shows a block diagram of an electronic compass, which uses the magnetoresistive sensor according to the disclosure.

This property is exploited, for example, for providing an electronic compass 200 that is insensitive to rotations with respect to the plane XY, as shown in FIG. 12.

In detail, the electronic compass 200 comprises a magnetoresistive sensor 201 formed by two Wheatstone bridges 202a, 202b (of the type shown in FIG. 4), formed respectively by resistors 10 and by resistors 11 and provided as shown in FIG. 5.

The outputs of the magnetoresistive sensor 201 are supplied to an amplifier stage 203, which performs also elimination of the offset, and then to a calculation stage 204, which determines the zenith angle on the basis of the equation:

$$\alpha = \arctan\frac{Hy}{Hx}$$

in a per se known manner.

The manufacture and assembly of the electronic compass 200 are thus considerably simplified, with consequent reduction of the associated costs.

Figure 13:
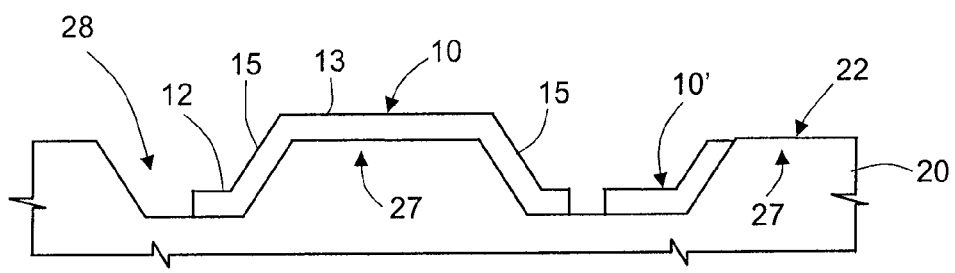
FIGS. 13 and 14 show possible variants of the magnetoresistive element of FIG. 5.
Figure 14:
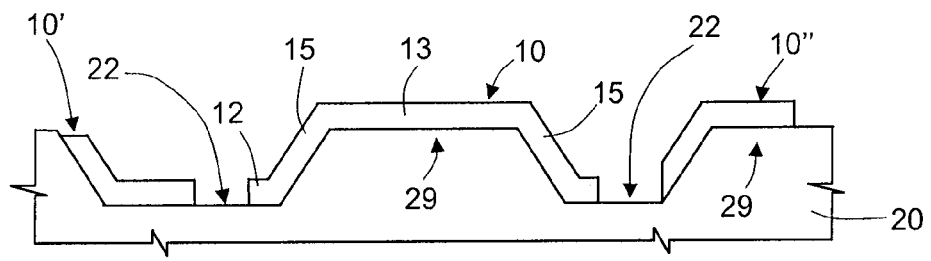

Finally, it is clear that numerous modifications and variations may be made to the magnetoresistive element, to the sensor, and to the method described and illustrated herein, all of which fall within the scope of the disclosure. For example, the magnetoresistive strips 10, 11 could be provided on a projecting region 27 obtained in a recess 28 of the planar surface 22, as shown for the magnetoresistor 10 of FIG. 13 or on a projection 29 of the planar surface 22, as shown in FIG. 14. In either case, the central portion 13 is formed on the planar top portion of the projection 27, 29, which extends parallel with respect to the upper surface 22 of the substrate 20. In addition or as an alternative, the end portions 12 or the central portion 13 could be absent (magnetoresistive strips 10' in FIGS. 13 and 14 and magnetoresistive strip 10" in FIG. 14).

The described magnetic sensor can moreover be used as protective cap of an inertial sensor, thus enabling a saving in space, as shown in FIGS. 15-18.

Figure 15:
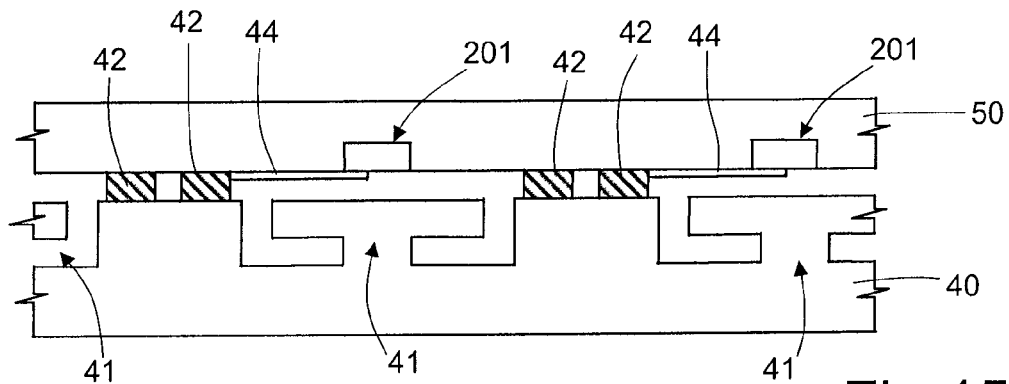
FIGS. 15-18 show possible applications of the present magnetoresistive element.
Figure 16:
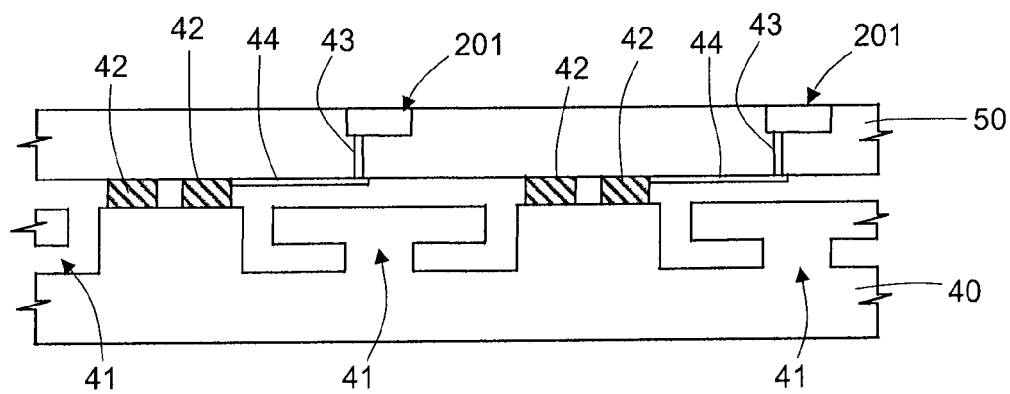

For example, a first wafer 40 of semiconductor material, which accommodates inertial sensors 41 (for instance, accelerometers or gyroscopes) can be bonded to a second wafer 50 accommodating magnetic sensors 201, as shown in FIG. 15. The two wafers can be connected via conductive regions 42 (for example, metal regions) to bring the contacts onto the plane of the inertial sensor 41. Alternatively (FIG. 16), if the magnetic sensors 201 are not facing the first wafer 40, through connections 43 may be provided.

Figure 17:
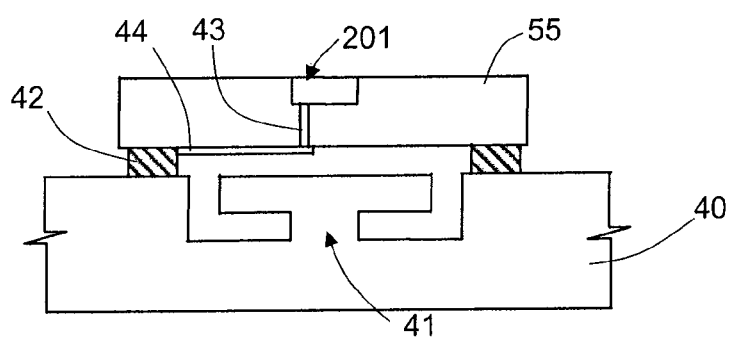

According to a different embodiment, the magnetic sensors 201 can be fixed to a first wafer 40 via the chip-wafer bonding technique, shown in FIG. 17. In this case, the magnetic sensors 201 are already cut so as to form chips 55 and are positioned using a pick-and-place machine and then bonded via the conductive regions 42. Thus, only the first wafer 40 is diced.

Bonding can be performed using any adhesive or metal material or also exploiting any desired silicon-silicon reaction, in which case the conductive regions 42 may be absent.

Figure 18:
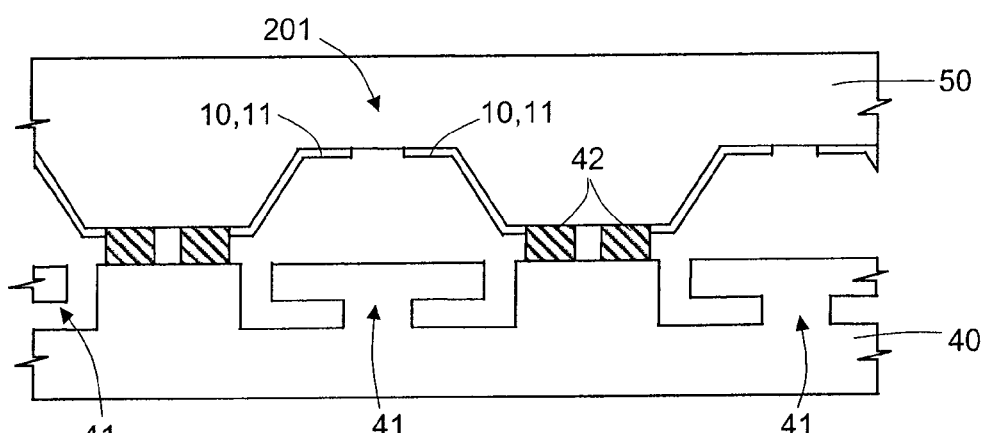

Possibly, the cavities 30, 31 accommodating the strips of magnetoresistive material 10 can be deeper in order to provide sufficient space for the movement of the inertial sensor 41, as shown in FIG. 18.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensor, comprising:
    a substrate of semiconductor material having an upper surface, a first sloping wall inclined with respect to said upper surface and extending longitudinally in a first direction, and a second sloping wall inclined with respect to said upper surface and extending longitudinally in a second direction substantially perpendicular to the first direction;
    a first plurality of magnetoresistive elements, each magnetoresistive element of the first plurality including a strip of magnetoresistive material formed on the substrate, said strip comprising a planar portion, extending substantially parallel to said upper surface, and a transverse portion extending on said first sloping wall, transversally to said upper surface, wherein the strips of said magnetoresistive elements of said first plurality are arranged substantially parallel to the second direction; and a second plurality of magnetoresistive elements, each magnetoresistive element of the second plurality including a strip of magnetoresistive material formed on the substrate, said strip comprising a planar portion, extending substantially parallel to said upper surface, and a transverse portion extending on said second sloping wall, transversally to said upper surface, wherein the strips of said magnetoresistive elements of said second plurality are arranged substantially parallel to the first direction.

2. A sensor according to claim 1, wherein the strips of said magnetoresistive elements of said first plurality are connected to form a first Wheatstone bridge for detecting a magnetic field parallel to said upper surface and perpendicular to said second direction.

3. A sensor according to claim 2, wherein the strips of said magnetoresistive elements of said second plurality are connected to form a second Wheatstone bridge for detecting a magnetic field parallel to said upper surface and to said second direction.

4. A sensor according to claim 1, wherein said planar portions and said transverse portions have each a respective area, a ratio of the areas of the transverse portions and the areas of the planar portions being selected to cause said sensor to be insensitive to a magnetic field directed in a third direction, perpendicular to said first and second directions.

5. A sensor according to claim 1, further comprising an inertial sensor formed in a wafer of semiconductor material bonded to said substrate, the substrate being configured to be a protective cap for the inertial sensor.

6. An electronic compass, comprising:
   a sensor that includes:
      a substrate of semiconductor material having an upper surface, a first sloping wall inclined with respect to said upper surface and extending longitudinally in a first direction, and a second sloping wall inclined with respect to said upper surface and extending longitudinally in a second direction substantially perpendicular to the first direction;
      a first plurality of magnetoresistive elements, each magnetoresistive element of the first plurality including a strip of magnetoresistive material formed on the substrate, said strip comprising a planar portion, extending substantially parallel to said upper surface, and a transverse portion extending on said first sloping wall, transversally to said upper surface, wherein the strips of said magnetoresistive elements of said first plurality are arranged substantially parallel to the second direction; and
      a second plurality of magnetoresistive elements, each magnetoresistive element of the second plurality including a strip of magnetoresistive material formed on the substrate, said strip comprising a planar portion, extending substantially parallel to said upper surface, and a transverse portion extending on said second sloping wall, transversally to said upper surface, wherein the strips of said magnetoresistive elements of said second plurality are arranged substantially parallel to the first direction; and
   a calculation unit coupled to said sensor and configured to calculate an angle of a magnetic field component parallel to said upper surface.

7. A compass according to claim 6, wherein the strips of said magnetoresistive elements of said first plurality are connected to form a first Wheatstone bridge for detecting a magnetic field parallel to said upper surface and perpendicular to said second direction.

8. A compass according to claim 7, wherein the strips of said magnetoresistive elements of said second plurality are connected to form a second Wheatstone bridge for detecting a magnetic field parallel to said upper surface and to said second direction.

9. A compass according to claim 6, wherein said planar portions and said transverse portions have each a respective area, a ratio of the areas of the transverse portions and the areas of the planar portions being selected to cause said sensor to be insensitive to a magnetic field directed in a third direction, perpendicular to said first and second directions.

10. A compass according to claim 6, further comprising an inertial sensor formed in a wafer of semiconductor material bonded to said substrate, the substrate being configured to be a protective cap for the inertial sensor.

11. A process, comprising:
   forming a substrate of semiconductor material having a upper surface;
   forming in the substrate a first sloping wall inclined with respect to said upper surface and extending longitudinally in a first direction;
   forming in the substrate a second sloping wall inclined with respect to said upper surface and extending longitudinally in a second direction substantially perpendicular to the first direction;
   forming a first plurality of magnetoresistive elements, each magnetoresistive element of the first plurality including a strip of magnetoresistive material formed on the substrate, said strip comprising a planar portion, extending substantially parallel to said upper surface, and a transverse portion extending on said first sloping wall, transversally to said upper surface, wherein the strips of said magnetoresistive elements of said first plurality are arranged substantially parallel to the second direction; and
   forming a second plurality of magnetoresistive elements, each magnetoresistive element of the second plurality including a strip of magnetoresistive material formed on the substrate, said strip comprising a planar portion, extending substantially parallel to said upper surface, and a transverse portion extending on said second sloping wall, transversally to said upper surface, wherein the strips of said magnetoresistive elements of said second plurality are arranged substantially parallel to the first direction.

12. A process according to claim 11, wherein forming the first sloping wall comprises forming a recess in said substrate.

13. A process according to claim 12, wherein forming the recess comprises etching the substrate using TMAH (tetramethylammonium hydroxide).

14. A process according to claim 12, wherein forming the first plurality of magnetoresistive elements:
   depositing a mask having a strip-shaped window extending partly on said recess and partly on said upper surface;
   depositing a magnetoresistive layer on said mask and in said recess, wherein strip-shaped portions of said magnetoresistive layer penetrate into said window; and
   lifting off said mask and said magnetoresistive layer except at said strip-shaped portions of said magnetoresistive layer.

15. A process according to claim 11, wherein said magnetoresistive layer is of a Fe—Ni alloy.

* * * * *